(12) United States Patent
Yuasa et al.

(10) Patent No.: US 9,691,722 B2
(45) Date of Patent: Jun. 27, 2017

(54) SURFACE MOUNT HIGH-FREQUENCY CIRCUIT

(71) Applicant: Mitsubishi Electric Corporation, Tokyo (JP)

(72) Inventors: Takeshi Yuasa, Tokyo (JP); Kiyoshi Ishida, Tokyo (JP); Yoshihiro Tsukahara, Tokyo (JP); Kohei Nishiguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/120,370

(22) PCT Filed: Mar. 26, 2014

(86) PCT No.: PCT/JP2014/058585
§ 371 (c)(1),
(2) Date: Aug. 19, 2016

(87) PCT Pub. No.: WO2015/145623
PCT Pub. Date: Oct. 1, 2015

(65) Prior Publication Data
US 2017/0077049 A1    Mar. 16, 2017

(51) Int. Cl.
*H01L 23/66* (2006.01)
*H01L 23/50* (2006.01)
(Continued)

(52) U.S. Cl.
CPC ............ *H01L 23/66* (2013.01); *H01L 23/481* (2013.01); *H01L 23/50* (2013.01);
(Continued)

(58) Field of Classification Search
CPC ... H01L 23/481; H01L 23/5283; H01L 23/66; H01L 24/06; H01L 24/14
See application file for complete search history.

(56) References Cited

U.S. PATENT DOCUMENTS 7,550,831 B2 *   6/2009  Nunokawa .............. H01L 23/04
                                                              257/433
2005/0288392 A1 * 12/2005  Okubora ................. H01L 23/04
                                                              523/176

FOREIGN PATENT DOCUMENTS

JP      H10-012675 A    1/1998
JP      2940478 B2      8/1999
(Continued)

OTHER PUBLICATIONS

International Search Report issued in PCT/JP2014/058585; mailed Jun. 17, 2014.

*Primary Examiner* — Whitney T Moore
*Assistant Examiner* — Joseph Galvin, III
(74) *Attorney, Agent, or Firm* — Studebaker & Brackett PC

(57) ABSTRACT

A surface mount high-frequency circuit is configured such that a plurality of ground pads 41 and a plurality of external connection ground conductors 51 are discretely disposed to surround a signal line pad 42 and an external connection signal line conductor 52, and a plurality of interlayer connection ground conductors 31 and that a plurality of columnar ground conductors 12 are discretely disposed to surround an interlayer connection signal line conductor 32. Thus, it is possible to suppress radiation of an unnecessary signal to the outside using a simple production process that is completed by only a wafer process without separately preparing a component such as a shield cover case.

8 Claims, 6 Drawing Sheets

(51) Int. Cl.
*H01L 23/00* (2006.01)
*H01L 23/48* (2006.01)
*H01L 23/528* (2006.01)
H01L 23/498 (2006.01)
H05K 1/02 (2006.01)

(52) U.S. Cl.
CPC .......... *H01L 23/5283* (2013.01); *H01L 24/02* (2013.01); *H01L 24/06* (2013.01); *H01L 24/14* (2013.01); H01L 23/49838 (2013.01); H01L 24/05 (2013.01); H01L 24/13 (2013.01); H01L 2224/02331 (2013.01); H01L 2224/02371 (2013.01); H01L 2224/02372 (2013.01); H01L 2224/02375 (2013.01); H01L 2224/02377 (2013.01); H01L 2224/02379 (2013.01); H01L 2224/02381 (2013.01); H01L 2224/0401 (2013.01); H01L 2224/05569 (2013.01); H01L 2224/13024 (2013.01); H01L 2224/14131 (2013.01); H01L 2224/14133 (2013.01); H01L 2224/14135 (2013.01); H01L 2224/14136 (2013.01); H01L 2224/14156 (2013.01); H01L 2224/14177 (2013.01); H01L 2224/14515 (2013.01); H01L 2224/16227 (2013.01); H05K 1/0243 (2013.01); H05K 2201/10674 (2013.01)

(56) References Cited

FOREIGN PATENT DOCUMENTS

| | | |
|---|---|---|
| JP | 2007-165739 A | 6/2007 |
| JP | 2008-047773 A | 2/2008 |
| JP | 4680763 B2 | 5/2011 |

\* cited by examiner

SURFACE MOUNT HIGH-FREQUENCY CIRCUIT

TECHNICAL FIELD

The present invention relates to a surface mount high-frequency circuit that is mounted such that a circuit formation surface of a dielectric substrate or a semiconductor substrate is directed toward a printed circuit board side.

BACKGROUND ART

In a surface mount high-frequency circuit disclosed in Patent Document 1 described below, an upper surface and side surfaces of a chip mounted such that a circuit formation surface is directed toward a printed circuit board side are metallized, and a periphery of a portion in the chip where the chip and the printed circuit board are connected is metallized.

In the surface mount high-frequency circuit, radiation of an unnecessary signal to the outside is suppressed by application of the metallization described above.

In a surface mount high-frequency circuit disclosed in Patent Document 2 described below, radiation of an unnecessary signal to the outside of a shield cover case is suppressed by arrangement of the shield cover case outside a chip.

CITATION LIST

Patent Document

Patent Document 1: Japanese Patent Application Laid-open No. H10-12675 (FIG. 1)
Patent Document 2: Japanese Patent Application Laid-open No. 2007-165739 (FIG. 1)

SUMMARY OF THE INVENTION

Problems to be Solved by the Invention

Since the conventional surface mount high-frequency circuit is configured as described above, in the case of Patent Document 1, in order to metallize the upper surface and the side surfaces of the chip, it is necessary that a metallization process which performs metallization to the chip separated into pieces be applied thereto. However, since the metallization process is not completed by only a wafer process in which a dielectric or a semiconductor constituting the chip is produced, there has been a problem that manufacturing steps are complicated.

On the other hand, in the case of Patent Document 2, it is possible to arrange the shield cover case outside the chip by a wafer process in which the dielectric or the semiconductor constituting the chip is produced, but it is necessary to separately prepare the shield cover case, and hence there been a problem that the number of components is increased.

The present invention has been made in order to solve the forgoing problems, and an object thereof is to obtain a surface mount high-frequency circuit capable of suppressing the radiation of the unnecessary signal to the outside using a simple production process that is completed by only the wafer process without separately preparing the component such as the shield cover case.

Means for Solving the Problems

A surface mount high-frequency circuit according to the present invention includes: a first substrate in which a first ground conductor is formed on a first surface, and a signal line conductor of a high-frequency circuit, a second ground conductor, and the high-frequency circuit are formed on a second surface opposing the first surface; an insulating layer which is deposited on the second surface side of the first substrate, and in which an interlayer connection ground conductor electrically connected to the second ground conductor and an interlayer connection signal line conductor electrically connected to the signal line conductor are formed inside; a ground conductor connection member that is electrically connected to the interlayer connection ground conductor; a signal line conductor connection member that is electrically connected to the interlayer connection signal line conductor; and a second substrate in which a front layer ground conductor electrically connected to the ground conductor connection member and a front layer signal line conductor electrically connected to the signal line conductor connection member are formed on a front layer, wherein a plurality of the ground conductor connection members are discretely disposed to surround the signal line conductor connection member, and a plurality of the interlayer connection ground conductors are discretely disposed to surround the interlayer connection signal line conductor.

Effect of the Invention

According to the present invention, since it is configured that the plurality of ground conductor connection members are discretely disposed to surround the signal line conductor connection member, and that the plurality of interlayer connection ground conductors are discretely disposed to surround the interlayer connection signal line conductor, there is an effect that radiation of an unnecessary signal to the outside can be suppressed using a simple production process that is completed by only a wafer process without separately preparing a component such as shield cover case.

BEST MODE FOR CARRYING OUT THE INVENTION

Hereinbelow, Embodiments of the present invention will be described in detail with reference to the drawings.

Embodiment 1

Figure 1:
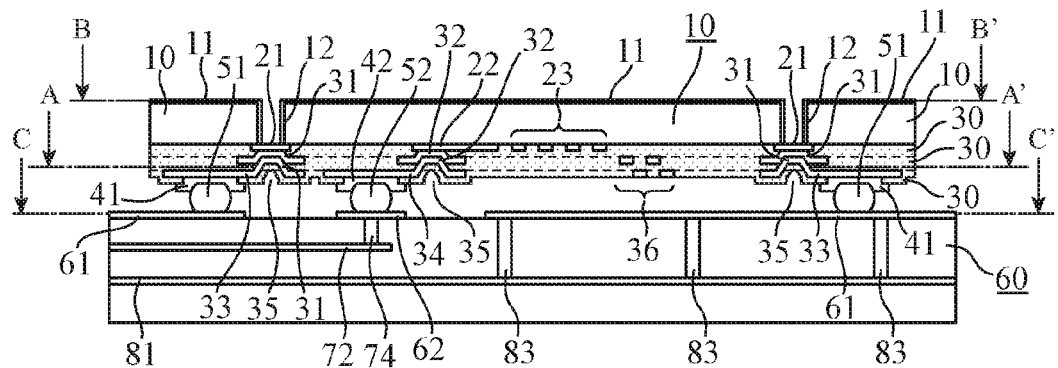
FIG. 1 is a side view showing a surface mount high-frequency circuit according to Embodiment 1 of the invention.

FIG. 1 is a side view showing a surface mount high-frequency circuit according to Embodiment 1 of the invention.

FIG. 2(a) is a cross-sectional view in a plane A-A' in the surface mount high-frequency circuit in FIG. 1, FIG. 2(b) is a cross-sectional view in a plane B-B' in the surface mount high-frequency circuit in FIG. 1, and FIG. 2(c) is a cross-sectional view in a plane C-C' in the surface mount high-frequency circuit in FIG. 1.

Note that the side view in FIG. 1 is also a cross-sectional view in a plane D-D' in the surface mount high-frequency circuit in FIG. 2(a).

The surface mount high-frequency circuit of Embodiment 1 is mounted such that a circuit formation surface of a semiconductor substrate 10 is directed toward the side of a printed circuit board 60.

Figure 2:
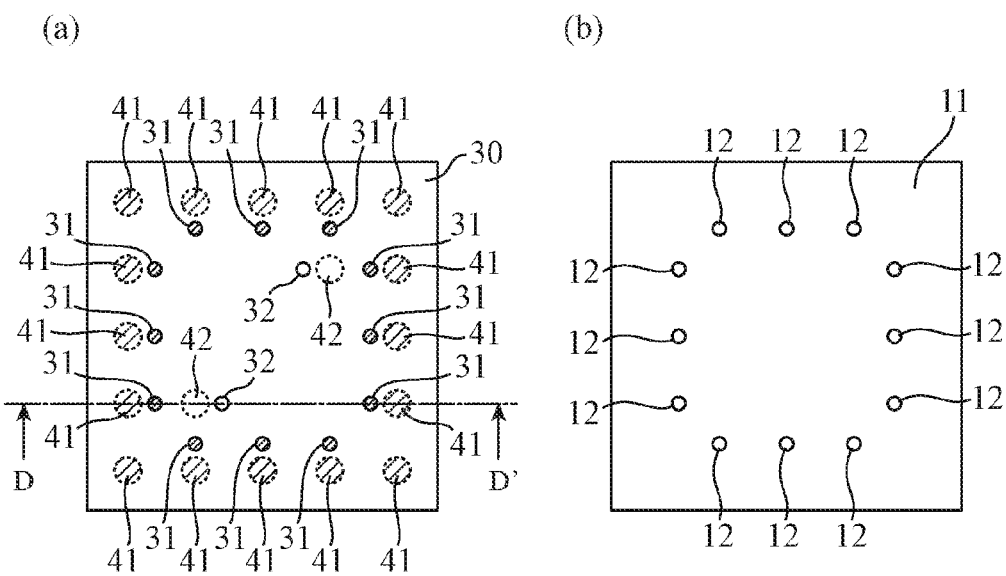
FIG. 2 is a cross-sectional view showing the surface mount high-frequency circuit according to Embodiment 1 of the invention.
Figure 2:
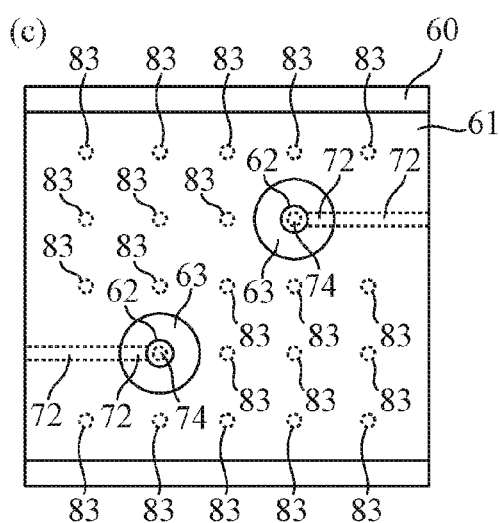

In FIG. 1 and FIG. 2, in the semiconductor substrate 10 of a first substrate, a ground conductor 11 of a first ground conductor is formed on an upper surface (first surface), and a ground conductor 21 of a second ground conductor, a signal line conductor 22 of a high-frequency circuit 23, and the high-frequency circuit 23 are formed on a lower surface (a second surface opposing the first surface).

In addition, a hole that passes through the upper surface and the lower surface is provided inside the semiconductor substrate 10, and a columnar ground conductor 12 that electrically connects the ground conductor 11 and the ground conductor 21 to each other is provided in the hole.

An insulating layer 30 is deposited on a lower layer of the semiconductor substrate 10. In an example in FIG. 1, three layers of the insulating layers 30 are deposited.

An interlayer connection ground conductor 31 that is electrically connected to the ground conductor 21 and an interlayer connection signal line conductor 32 that is electrically connected to the signal line conductor 22 are formed inside the insulating layers 30. In the example in FIG. 1, since the three insulating layers 30 are provided, two of the interlayer connection ground conductors 31 are stacked on each other with electrically connected to each other, and two of the interlayer connection signal line conductors 32 are stacked on each other with electrically connected to each other.

In addition, a high-frequency circuit 36 including a signal line conductor is disposed inside the insulating layers 30.

A ground pad 41 and a signal line pad 42 are provided on a lower surface of the insulating layer 30.

The ground pad 41 is electrically connected to the interlayer connection ground conductor 31 through a ground conductor 33, and the signal line pad 42 is electrically connected to the interlayer connection signal line conductor 32 through a signal line conductor 34.

An external connection ground conductor 51 is held by the ground pad 41 with electrically connected to the ground pad 41.

An external connection signal line conductor 52 is held by the signal line pad 42 with electrically connected to the signal line pad 42.

Note that a ground conductor connection member is constituted by the ground conductor 33, the ground pad 41, and the external connection ground conductor 51.

In addition, a signal line conductor connection member is constituted by the signal line conductor 34, the signal line pad 42, and the external connection signal line conductor 52.

In the example in FIG. 1, the interlayer connection ground conductor 31 is formed at a position different from that of the ground pad 41 when viewed from the side of the plane A-A' or the opposite side of the plane A-A' in FIG. 1 in a normal direction.

Similarly, the interlayer connection signal line conductor 32 is formed at a position different from that of the signal line pad 42 when viewed from the side of the plane A-A' or the opposite side of the plane A-A' in FIG. 1 in the normal direction.

A plurality of the interlayer connection ground conductors 31 and a plurality of columnar ground conductors 12 are discretely disposed to surround the interlayer connection signal line conductor 32.

In addition, a plurality of the ground pads 41 and a plurality of the external connection ground conductors 51 are discretely disposed to surround the signal line pad 42 and the external connection signal line conductor 52.

In Embodiment 1, an arrangement of the interlayer connection ground conductors 31 that are plurally discretely disposed is positioned on the inner side of an arrangement of the ground pads 41 that are plurally discretely disposed.

The printed circuit board 60 of a second substrate is provided on the lower side of the insulating layer 30, and a ground pad 61 of a front layer ground conductor and a signal line pad 62 of a front layer signal line conductor are formed on a front layer thereof.

The ground pad 61 is disposed to surround the signal line pad 62, and is electrically connected to the external connection ground conductor 51.

The signal line pad 62 is electrically connected to the external connection signal line conductor 52.

A signal line conductor 72 and a ground conductor 81 are formed in inner layers of the printed circuit board 60, and the signal line conductor 72 is electrically connected to the signal line pad 62 through a columnar signal line conductor 74, and the ground conductor 81 is electrically connected to the ground pad 61 through a plurality of columnar ground conductors 83.

Next, a wafer process will be described.

The interlayer connection ground conductor 31 and the interlayer connection signal line conductor 32 in the insulating layer 30 are structures to be produced in the wafer process, and are formed by stacking the insulating layer 30 having a thickness of about several microns per layer on the surface of the semiconductor substrate 10 and then causing the interlayer connection ground conductor 31 and the interlayer connection signal line conductor 32 to pass through the insulating layer 30.

Further, the production is made by repeating a sequence in which after the insulating layer 30 is stacked on the surface, the interlayer connection ground conductor 31 and the interlayer connection signal line conductor 32 are caused to pass through the insulating layer 30.

As the number of the insulating layers 30 increases by execution of this process, depressions 35 are accumulated in portions where the interlayer connection ground conductor 31 and the interlayer connection signal line conductor 32 are disposed.

Consequently, in the case where the interlayer connection ground conductor 31 and the ground pad 41 are disposed at the same position, and the interlayer connection signal line conductor 32 and the signal line pad 42 are also disposed at the same position, when viewed from the side of the plane A-A' or the opposite side of the plane A-A' in FIG. 1 in the normal direction, flatness of the ground pad 41 and the signal line pad 42 is affected by the depressions 35 to be hindered.

In the case where the flatness of the ground pad 41 and the signal line pad 42 is hindered, a possibility that poor connection occurs in the external connection ground conductor 51 and the external connection signal line conductor 52 is increased.

Accordingly, in Embodiment 1, the interlayer connection ground conductor 31 is disposed at a position different from that of the ground pad 41 and the interlayer connection signal line conductor 32 is disposed at a position different from that of the signal line pad 42, when viewed from the side of the plane A-A' or the opposite side of the plane A-A' in FIG. 1 in the normal direction.

In this manner, a structure capable of securing the flatness of the ground pad 41 and the signal line pad 42 is obtained.

On this occasion, with regard to a disposition layer of the interlayer connection signal line conductor 32, a plurality of the interlayer connection ground conductors 31, a plurality of the ground conductors 21, and a plurality of the columnar ground conductors 12 are discretely disposed to surround the interlayer connection signal line conductor 32.

In addition, with regard to disposition layers of the signal line conductor 34, the signal line pad 42, and the external connection signal line conductor 52, a plurality of the ground conductors 33, a plurality of the ground pads 41, and a plurality of the external connection ground conductors 51 are discretely disposed to surround the signal line conductor 34, the signal line pad 42, and the external connection signal line conductor 52.

In this manner, a structure that meets proper suppression of radiation of an unnecessary signal to leak to the outside of the semiconductor substrate 10, and simple manufacturing to be completed by the wafer process at the same time is obtained.

In the printed circuit board 60, the ground pad 61, the ground conductor 81, and a plurality of the columnar ground conductors 83 are disposed to surround the signal line pad 62, the signal line conductor 72, and the columnar signal line conductor 74.

In this manner, in addition to the effect of suppressing the unnecessary radiation on the side of the semiconductor substrate 10, it becomes possible to properly suppress also radiation of the unnecessary signal to leak to the outside of the printed circuit board 60.

Figure 3:
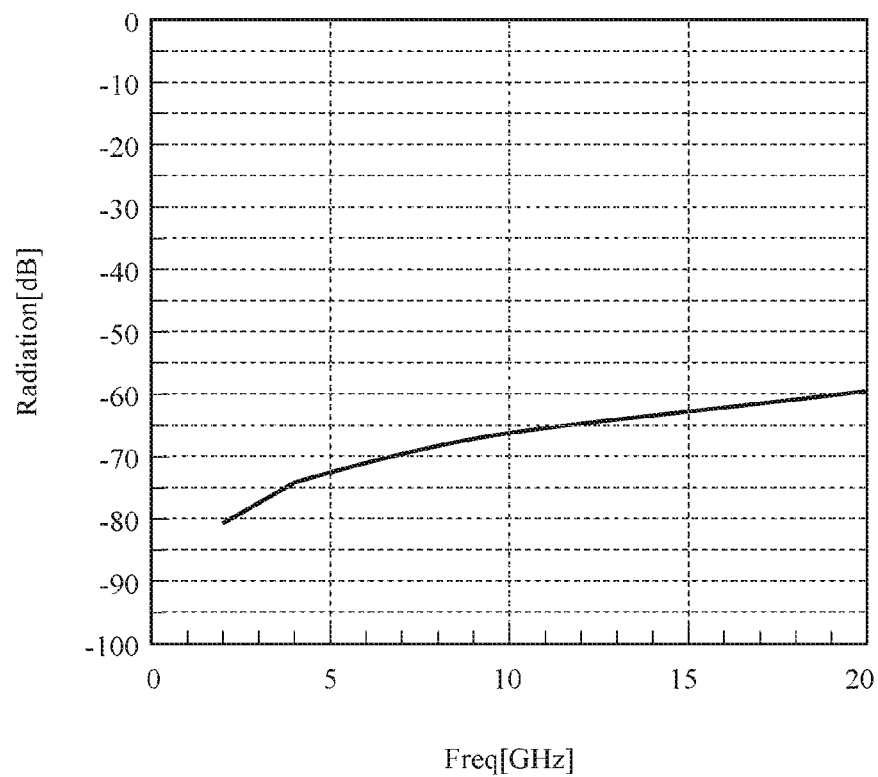
FIG. 3 is an explanatory view showing a result of calculation of an effect by a structure of the surface mount high-frequency circuit in FIG. 1 by using a three-dimensional electromagnetic field simulation.

Herein, FIG. 3 is an explanatory view showing a result of calculation of an effect by a structure of the surface mount high-frequency circuit in FIG. 1 by using a three-dimensional electromagnetic field simulation.

In FIG. 3, when the electromagnetic simulation was carried out with the following assumption: a dielectric constant of the semiconductor substrate 10 was 12.9; a dielectric constant of the insulating layer 30 was 3.5; an interval between the external connection ground conductors 51 was 0.7 mm; and a dielectric constant of the printed circuit board 60 was 3.7, frequency characteristics of the unnecessary signal to leak to the outside are represented.

It is achieved to secure a value of −60 dB, at which a ratio of the unnecessary signal to an input signal is sufficiently low at or below a frequency of 20 GHz, so that the effect of suppressing the radiation of the unnecessary signal can be confirmed.

As is apparent from the above description, according to Embodiment 1, it is configured that the plurality of the ground pads 41 and the plurality of the external connection ground conductors 51 are discretely disposed to surround the signal line pad 42 and the external connection signal line conductor 52, and that the plurality of the interlayer connection ground conductors 31 and the plurality of the columnar ground conductors 12 are discretely disposed to surround the interlayer connection signal line conductor 32, and hence the effect is achieved in which the radiation of the unnecessary signal to the outside can be suppressed is achieved using the simple production process that is completed by only the wafer process, without separately preparing a component such as a shield cover case.

In addition, according to Embodiment 1, the ground pad 61, the ground conductor 81, and the plurality of the columnar ground conductors 83 are disposed to surround the signal line pad 62, the signal line conductor 72, and the columnar signal line conductor 74, and hence the effect in which the radiation of the unnecessary signal to leak to the outside of the printed circuit board 60 can also be suppressed properly is achieved.

Further, according to Embodiment 1, the interlayer connection ground conductor 31 is disposed at a position different from that of the ground pad 41 and the interlayer connection signal line conductor 32 is disposed at a position different from that of the signal line pad 42, when viewed from the side of the plane A-A' or the opposite side of the plane A-A' in FIG. 1 in the normal direction, and hence the effect in which the flatness of the ground pad 41 and the signal line pad 42 can be suppressed to thereby prevent the occurrence of the poor connection in the external connection ground conductor 51 and the external connection signal line conductor 52 is achieved.

Note that, in Embodiment 1, the example in which the first substrate is the semiconductor substrate 10 has been described, but a dielectric substrate having a structure similar to that of the semiconductor substrate 10 may also be applied as the first substrate.

In addition, in Embodiment 1, the example in which the interlayer connection ground conductor 31 and the ground pad 41 are connected to each other via the ground conductor 33 on a one-to-one basis has been described, but the adjacent ground pads 41 may also be connected to each other via the ground conductor 33. Further, all of the ground pads 41 that surround the interlayer connection signal line conductor 32 may also be connected to each other via the ground conductor 33.

Similarly, the adjacent interlayer connection ground conductors 31 may also be connected to each other via the ground conductor 33, and all of the interlayer connection ground conductors 31 that surround the interlayer connection signal line conductor 32 may also be connected to each other via the ground conductor 33.

Further, in Embodiment 1, the example in which the interlayer connection ground conductor 31 and the columnar ground conductor 12 are disposed at the same position, when viewed from the side of the plane A-A' or the opposite side of the plane A-A' in FIG. 1 in the normal direction has been described, but the interlayer connection ground conductor 31 and the columnar ground conductor 12 may also be disposed at different positions, when viewed from the side of the plane A-A' or the opposite side of the plane A-A' in FIG. 1 in the normal direction.

However, in this case, the interlayer connection ground conductor 31 and the columnar ground conductor 12 need to be electrically connected to each other through the ground conductor 21 at at least one or more locations.

Embodiment 2

Figure 4:
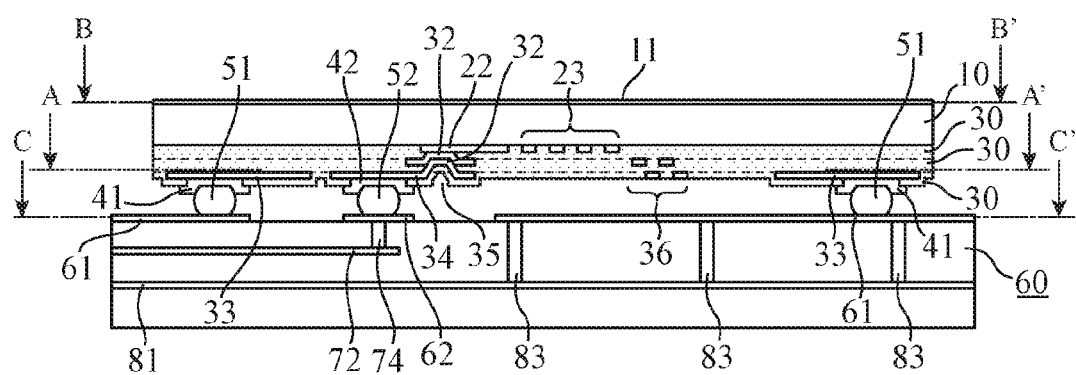
FIG. 4 is a side view showing a surface mount high-frequency circuit according to Embodiment 2 of the invention.

FIG. 4 is a side view showing a surface mount high-frequency circuit according to Embodiment 2 of the invention.

Figure 5:
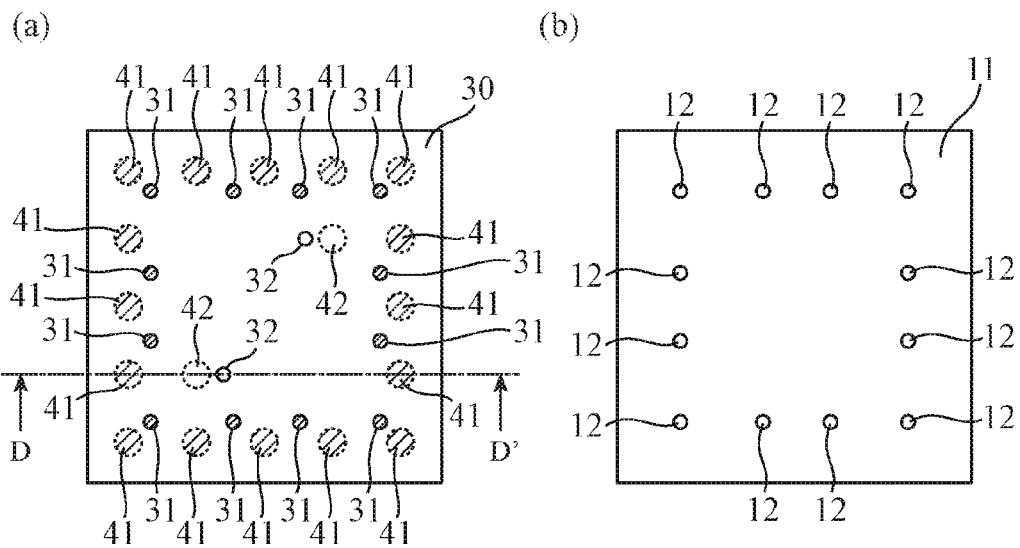
FIG. 5 is a cross-sectional view showing the surface mount high-frequency circuit according to Embodiment 2 of the invention.

FIG. 5(a) is a cross-sectional view in a plane A-A' in the surface mount high-frequency circuit in FIG. 4, FIG. 5(b) is a cross-sectional view in a plane B-B' in the surface mount high-frequency circuit in FIG. 4, and FIG. 5(c) is a cross-sectional view in a plane C-C' in the surface mount high-frequency circuit in FIG. 4.

Note that the side view in FIG. 4 is also a cross-sectional view in a plane D-D' in the surface mount high-frequency circuit in FIG. 5(a).

Similarly to Embodiment 1 described above, the surface mount high-frequency circuit of Embodiment 2 has a structure in which an arrangement of interlayer connection ground conductors 31 and columnar ground conductors 12 that are plurally discretely disposed is positioned on the inner side of an arrangement of ground pads 41 that are plurally discretely disposed, and the arrangement of the interlayer connection ground conductors 31 and the columnar ground conductors 12 is disposed to be positioned alternately with the arrangement of the ground pads 41.

The other structures are the same as those in Embodiment 1 described above.

Also in Embodiment 2, similarly to Embodiment 1 described above, a ground conductor 33 is used for an electrical connection between the interlayer connection ground conductor 31 and the ground pad 41.

The interlayer connection ground conductor 31 has only to be connected to the single ground pad 41 proximate to the interlayer connection ground conductor with the use of the ground conductor 33, and may also be connected to the two or more ground pads 41 at the same time with the use of the ground conductor 33.

In addition, similarly to Embodiment 1 described above, all of the ground pads 41 surrounding the interlayer connection signal line conductor 32 may be connected to each other via the ground conductor 33, and all of the interlayer connection ground conductors 31 surrounding the interlayer connection signal line conductor 32 may also be connected to each other via the ground conductor 33.

In Embodiment 2, an inner side of an area surrounded by the interlayer connection ground conductors 31 and the columnar ground conductors 12 shown in FIG. 5(a) and FIG. 5(b) serves as an area where a high-frequency circuit 23 can be arranged.

Therefore, it is possible to use as a circuit disposition area, an area in the vicinity of four corners of the semiconductor substrate 10 in which the high-frequency circuit 23 cannot be arranged in the structure in Embodiment 1 described above. As a result, it becomes possible to enlarge a circuit formation area under conditions of the same chip size and the same ground pad pitch.

Consequently, according to Embodiment 2, in addition to the same effect as that obtained in Embodiment 1 described above, an effect in which a formation area of the high-frequency circuit 23 can be enlarged is obtained.

Embodiment 3

Figure 6:
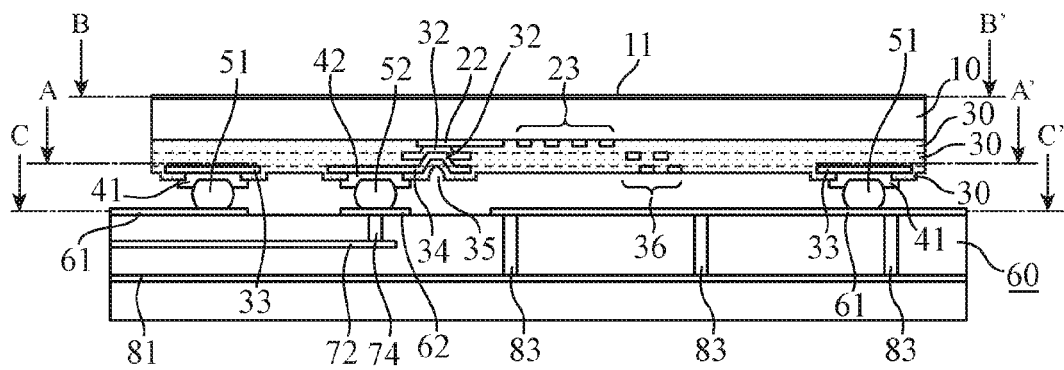
FIG. 6 is a side view showing a surface mount high-frequency circuit according to Embodiment 3 of the invention.

FIG. 6 is a side view showing a surface mount high-frequency circuit according to Embodiment 3 of the invention.

Figure 7:
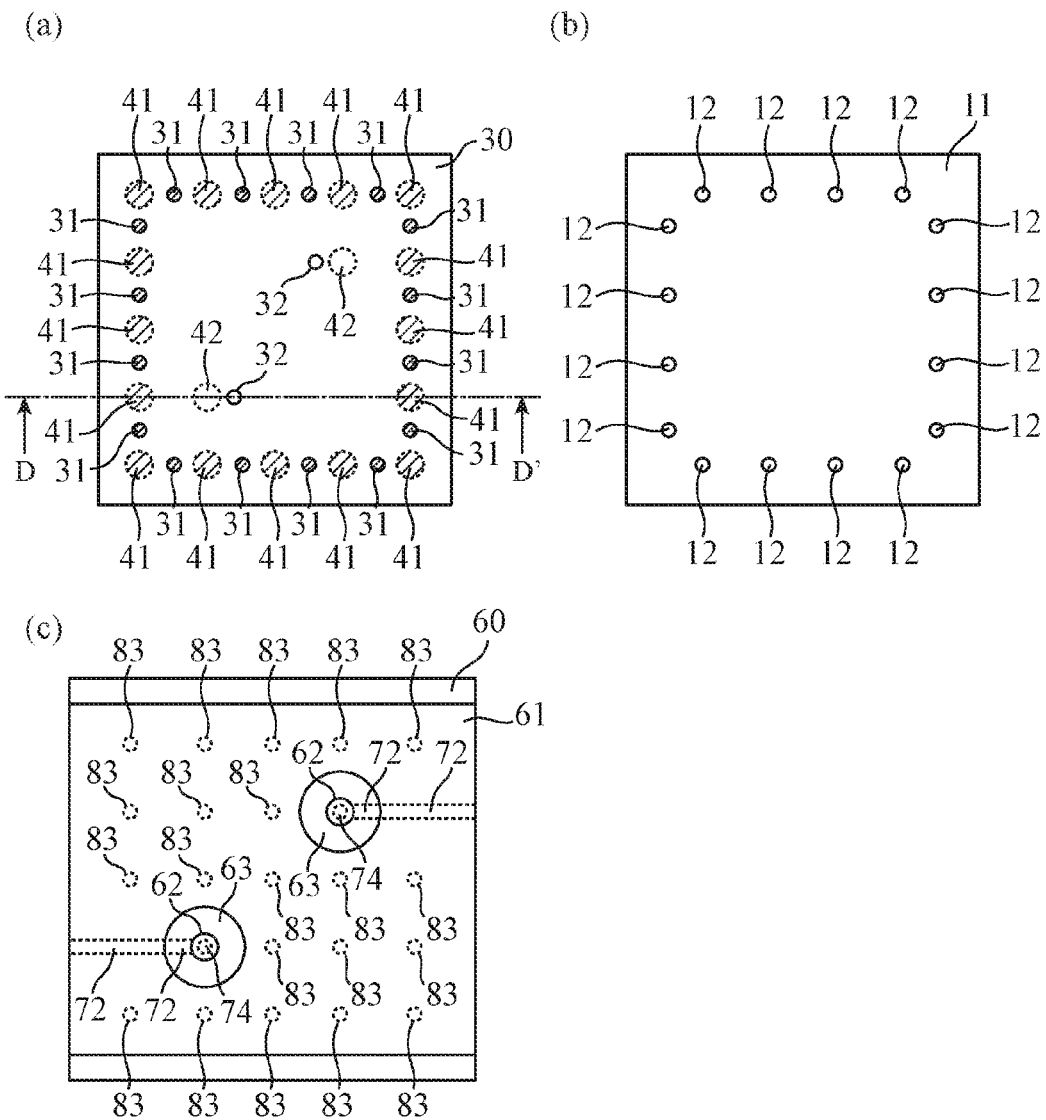
FIG. 7 is a cross-sectional view showing the surface mount high-frequency circuit according to Embodiment 3 of the invention.

FIG. 7(a) is a cross-sectional view in a plane A-A' in the surface mount high-frequency circuit in FIG. 6, FIG. 7(b) is a cross-sectional view in a plane B-B' in the surface mount high-frequency circuit in FIG. 6, and FIG. 7(c) is a cross-sectional view in a plane C-C' in the surface mount high-frequency circuit in FIG. 6.

Note that the side view in FIG. 6 is also a cross-sectional view in a plane D-D' in the surface mount high-frequency circuit in FIG. 7(a).

In the surface mount high-frequency circuit in each of Embodiments 1 and 2 described above, the example of the structure in which the arrangement of the interlayer connection ground conductors 31 and the columnar ground conductors 12 that are plurally discretely disposed is positioned on the inner side of the arrangement of the ground pads 41 that are plurally discretely disposed has been described, but the surface mount high-frequency circuit of Embodiment 3 has a structure in which an arrangement of interlayer connection ground conductors 31 and columnar ground conductors 12 that are plurally discretely disposed and an arrangement of ground pads 41 that are plurally discretely disposed are positioned on the same circulation.

The other structures are the same as those in each of Embodiments 1 and 2 described above.

Also in Embodiment 3, similarly to Embodiments 1 and 2 described above, a ground conductor 33 is used for an electrical connection between the interlayer connection ground conductor 31 and the ground pad 41.

The interlayer connection ground conductor 31 has only to be connected to the single ground pad 41 proximate to the interlayer connection ground conductor with the use of the ground conductor 33, and may also be connected to the two or more ground pads 41 at the same time with the use of the ground conductor 33.

In addition, similarly to Embodiments 1 and 2 described above, all of the ground pads 41 that surround the interlayer connection signal line conductor 32 may be connected to each other via the ground conductor 33, and all of the interlayer connection ground conductors 31 that surround the interlayer connection signal line conductor 32 may also be connected to each other via the ground conductor 33.

In Embodiment 3, an inner side of an area surrounded by the interlayer connection ground conductors 31 and the columnar ground conductors 12 shown in FIG. 7(a) and FIG. 7(b) serves as an area where the high-frequency circuit 23 can be arranged.

Therefore, it is possible to make a disposition area of the high-frequency circuit 23 larger than that in each of Embodiments 1 and 2 described above.

In addition, in Embodiment 3, when the ground conductor 33 is disposed in a circulating direction in which the ground pads 41 are arranged, it becomes possible to simply implement the electrical connection between the interlayer connection ground conductor 31 and the ground pad 41.

As a result, in each of Embodiments 1 and 2 described above, the structure in which the ground conductor 33 is extended toward the inner area of the semiconductor substrate 10 and the insulating layer 30 where the signal line conductor 34 is disposed is provided, but in Embodiment 3, the structure in which the ground conductor 33 is extended is not necessary, and hence it becomes possible to enlarge disposition areas of a lead wire formed in the insulating layer 30 and the high-frequency circuit 36 formed in the insulating layer 30.

Consequently, according to Embodiment 3, in addition to the same effect as that obtained in Embodiment 1 described above, an effect in which formation areas of the high-frequency circuits 23 and 36 can be enlarged is obtained.

Embodiment 4

Figure 8:
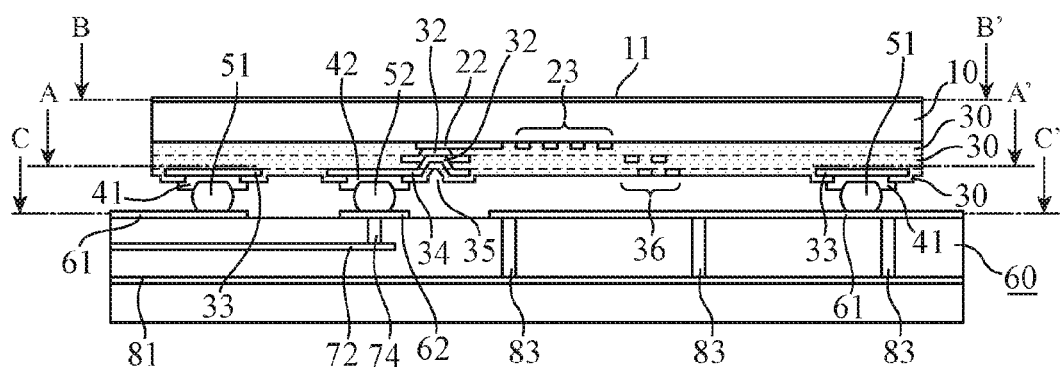
FIG. 8 is a side view showing a surface mount high-frequency circuit according to Embodiment 4 of the invention.

FIG. 8 is a side view showing a surface mount high-frequency circuit according to Embodiment 4 of the invention.

Figure 9:
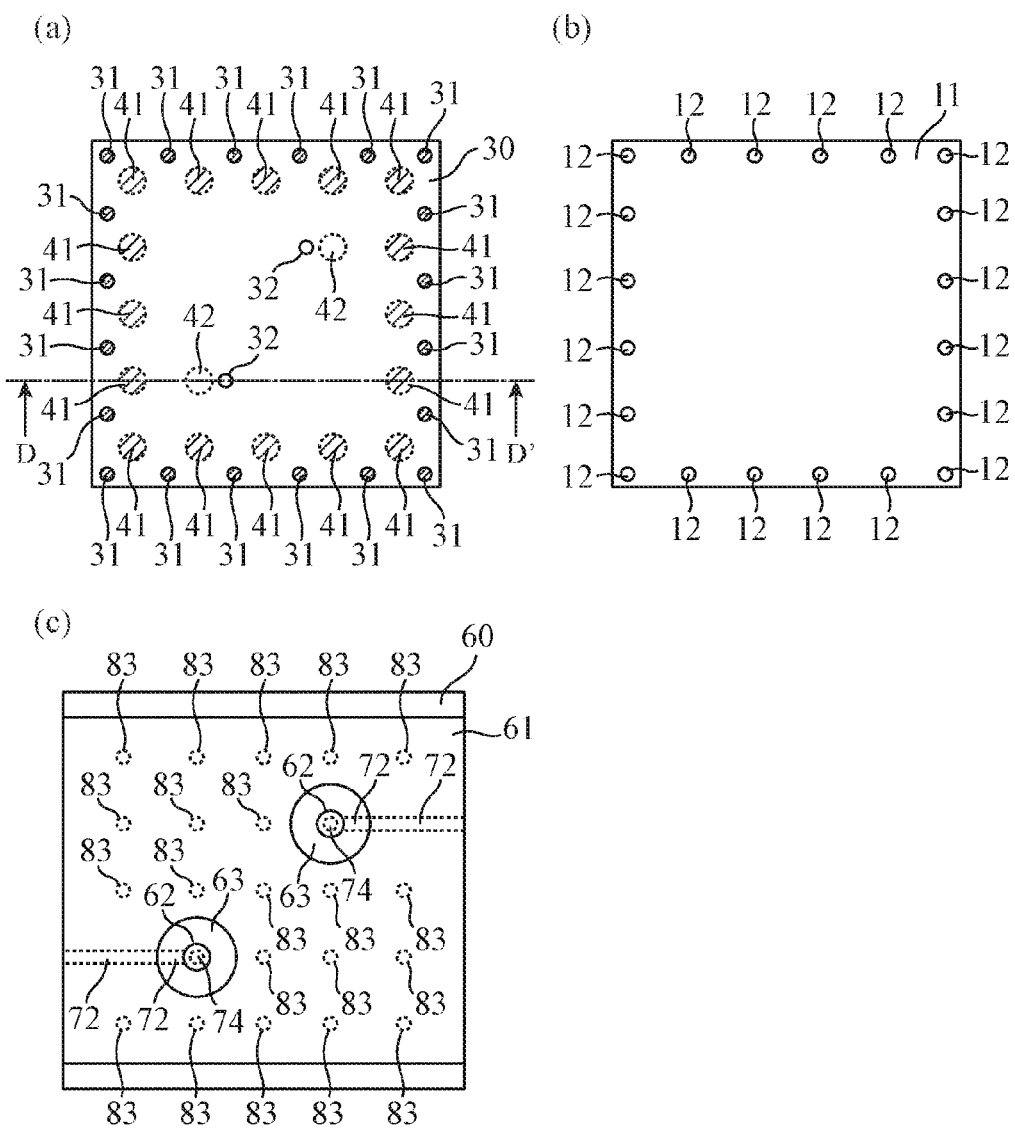
FIG. 9 is a cross-sectional view showing the surface mount high-frequency circuit according to Embodiment 4 of the invention.

FIG. 9(a) is a cross-sectional view in a plane A-A' in the surface mount high-frequency circuit in FIG. 8, FIG. 9(b) is a cross-sectional view in a plane B-B' in the surface mount high-frequency circuit in FIG. 8, and FIG. 9(c) is a cross-sectional view in a plane C-C' in the surface mount high-frequency circuit in FIG. 8.

Note that the side view in FIG. 8 is also a cross-sectional view in a plane D-D' in the surface mount high-frequency circuit in FIG. 9(a)

In the surface mount high-frequency circuit in each of Embodiments 1 and 2 described above, the example of the structure in which the arrangement of the interlayer connection ground conductors 31 and the columnar ground conductors 12 that are plurally discretely disposed is positioned on the inner side of the arrangement of the ground pads 41 that are plurally discretely disposed has been described, but the surface mount high-frequency circuit of Embodiment 4 has a structure in which an arrangement of interlayer connection ground conductors 31 and columnar ground conductors 12 that are plurally discretely disposed is positioned on the outer side of an arrangement of ground pads 41 that are plurally discretely disposed.

The other structures are the same as those in each of Embodiments 1 and 2 described above.

Also in Embodiment 4, similarly to Embodiments 1 to 3 described above, a ground conductor 33 is used for an electrical connection between the interlayer connection ground conductor 31 and the ground pad 41.

The interlayer connection ground conductor 31 has only to be connected to the single ground pad 41 proximate to the interlayer connection ground conductor with the use of the ground conductor 33, and may also be connected to the two or more ground pads 41 at the same time with the use of the ground conductor 33.

In addition, similarly to Embodiments 1 to 3 described above, all of the ground pads 41 that surround the interlayer connection signal line conductor 32 may be connected to each other via the ground conductor 33, and all of the interlayer connection ground conductors 31 that surround the interlayer connection signal line conductor 32 may also be connected to each other via the ground conductor 33.

In Embodiment 4, an inner side of an area surrounded by the interlayer connection ground conductors 31 and the columnar ground conductors 12 shown in FIG. 9(a) and FIG. 9(b) serves as an area where a high-frequency circuit 23 can be arranged.

Therefore, it is possible to make a disposition area of a high-frequency circuit 23 larger than that in each of Embodiments 1 to 3 described above.

In addition, in Embodiment 4, it becomes possible to make disposition areas of a lead wire formed in an insulating layer 30 and a high-frequency circuit 36 formed in the insulating layer 30 larger than that in each of Embodiments 1 to 3 described above.

Consequently, according to Embodiment 4, in addition to the same effect as that obtained in Embodiment 1 described above, an effect in which formation areas of the high-frequency circuits 23 and 36 can be enlarged is obtained.

Embodiment 5

Figure 10:
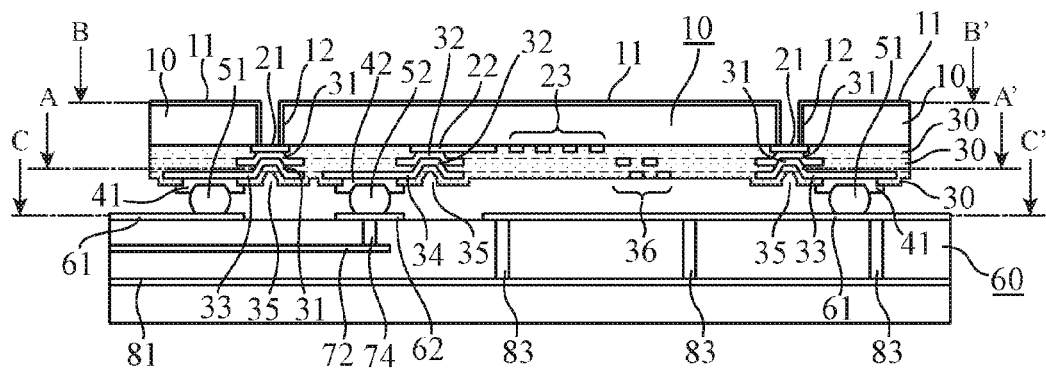
FIG. 10 is a side view showing the surface mount high-frequency circuit according to Embodiment 5 of the invention.

FIG. 10 is a side view showing a surface mount high-frequency circuit according to Embodiment 5 of the invention.

Figure 11:
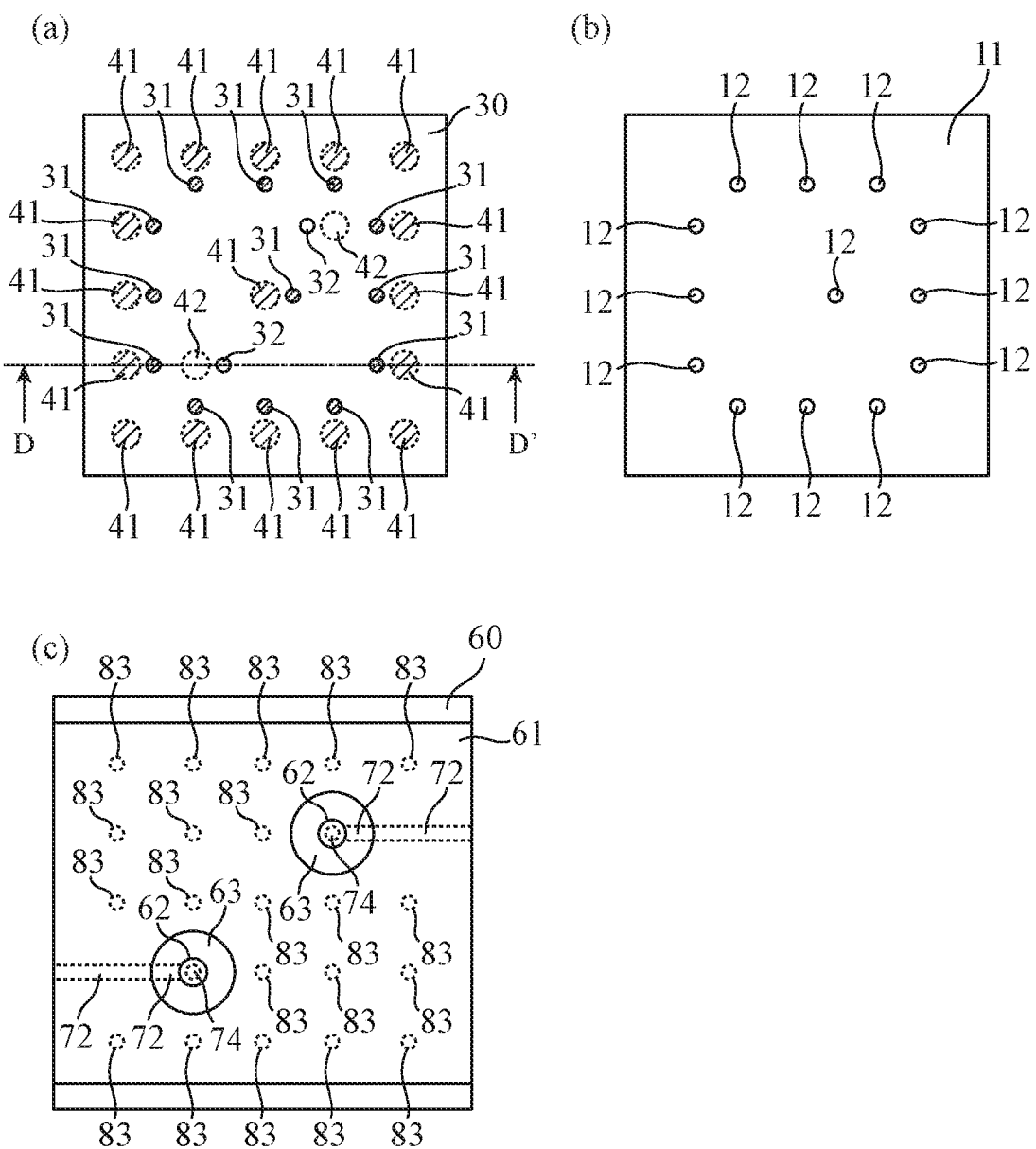
FIG. 11 is a cross-sectional view showing the surface mount high-frequency circuit according to Embodiment 5 of the invention.

FIG. 11(a) is a cross-sectional view in a plane A-A' plane in the surface mount high-frequency circuit in FIG. 10, FIG. 11(b) is a cross-sectional view in a plane B-B' in the surface mount high-frequency circuit in FIG. 10, and FIG. 11(c) is a cross-sectional view in a plane C-C' in the surface mount high-frequency circuit in FIG. 10.

Note that the side view in FIG. 10 is also a cross-sectional view in a plane D-D' in the surface mount high-frequency circuit in FIG. 11(a).

With respect to the surface mount high-frequency circuit of Embodiment 1 described above, the surface mount high-frequency circuit of Embodiment 5 as a structure obtained by newly adding thereto an internal ground group including a ground pad 41, an external connection ground conductor 51, an interlayer connection ground conductor 31, a ground conductor 21, and a columnar ground conductor 12 to an inner area (in the vicinity of a central portion of an insulating layer 30 and a semiconductor substrate 10) surrounded by ground pads 41 and interlayer connection ground conductors 31 that are plurally discretely disposed.

In this regard, the ground pad 41 and the interlayer connection ground conductor 31 in the newly added inner ground group are electrically connected to each other through the ground conductor 21. In addition, the ground pad 41 is electrically connected to the ground pad 61 through the external connection ground conductor 51.

The other structures are the same as those in Embodiment 1 described above.

In Embodiment 1 described above, an inner area surrounded by the ground pad 41, the interlayer connection ground conductor 31, and the columnar ground conductor 12 has a natural resonance frequency, and unnecessary coupling or radiation is caused in the vicinity of the resonance frequency; in relation to this, there is a possibility that circuit characteristics thereof are degraded.

In Embodiment 5, the ground pad 41, the interlayer connection ground conductor 31, and the columnar ground conductor 12 are newly added in the vicinity of the central portion of the insulating layer 30 and the semiconductor substrate 10, and hence it is possible to increase the natural resonance frequency described above. Therefore, it becomes possible to avoid degradation of circuit characteristics thereof, and application of the present surface mount high-frequency circuit in a higher frequency band becomes possible.

In addition, in Embodiment 1 described above, coupling between signal line portions in two pairs of the signal line pad 42 and the interlayer connection signal line conductor 32 provided at two locations increases as the frequency increases; thus, there is a possibility that the circuit characteristics are degraded.

In Embodiment 5, the ground pad 41, the interlayer connection ground conductor 31, and the columnar ground conductor 12 are newly added in the vicinity of the central portion of the insulating layer 30 and the semiconductor substrate 10, and hence a structure in which the signal line pad 42 and the interlayer connection signal line conductor 32 can be electrically isolated is provided.

Consequently, in Embodiment 5, as compared with Embodiment 1 described above, it is possible to reduce electromagnetic field coupling between signal line conductors inside the surface mount high-frequency circuit, and hence the structure capable of avoiding the degradation of the circuit characteristics is obtained.

In addition, in Embodiment 5, it is possible to dissipate heat generated from the high-frequency circuit 23 through the ground pad 41, the interlayer connection ground conductor 31, and the columnar ground conductor 12 that are newly added in the vicinity of the central portion of the insulating layer 30 and the semiconductor substrate 10.

That is, in Embodiment 5, it is possible to dispose the ground pad 41, the interlayer connection ground conductor 31, and the columnar ground conductor 12 at positions close to a heat generating portion of the high-frequency circuit 23, and hence a heat dissipation effect is enhanced as compared with a structure in which heat is dissipated from the ground conductor disposed around the surface mount high-frequency circuit as in Embodiment 1 described above, and it becomes possible to achieve a higher output circuit.

Consequently, according to Embodiment 5, in addition to the same effect as that obtained in Embodiment 1 described above, an effect of avoiding the degradation of the circuit characteristics caused by the unnecessary coupling or radiation to allow application to a higher frequency band, and of obtaining the structure that enhances the heat dissipation effect to allow implementation of the higher output circuit is obtained.

In Embodiment 5, the example of the structure in which the ground pad 41, the interlayer connection ground conductor 31, and the columnar ground conductor 12 are disposed at one location between the two pairs of the signal line pad 42 and the interlayer connection signal line conductor 32 at the two locations has been described, but the ground conductors may also be disposed at two or more locations, and a structure in which the number of the ground conductors is increased to surround each of the signal line pads 42 and interlayer connection signal line conductor 32 may also be adopted.

In addition, the ground pad 41 and the interlayer connection ground conductor 31 that are newly added may be electrically connected to each other through the ground pad 41, the interlayer connection ground conductor 31, and the ground conductor 33 illustrated in FIG. 1, and the ground conductors 33 may be continuously disposed to surround the signal line pad 42 and the interlayer connection signal line conductor 32.

Note that, in the invention of the present application, it is possible to freely combine the embodiments, modify any components of the embodiments, or omit any components in the embodiments within the scope of the invention.

INDUSTRIAL APPLICABILITY

The surface mount high-frequency circuit according to the invention is suitable as the one that is required to suppress the radiation of the unnecessary signal to the outside using the simple production process that is completed only by the wafer process without separately preparing the component such as the shield cover case.

DESCRIPTION OF REFERENCE NUMERALS AND SIGNS

10: semiconductor substrate (first substrate)
11: ground conductor (first ground conductor)
12: columnar ground conductor
21: ground conductor (second ground conductor)
22: signal line conductor
23: high-frequency circuit
30: insulating layer
31: interlayer connection ground conductor
32: interlayer connection signal line conductor
33: ground conductor (ground conductor connection member)
34: signal line conductor (signal line conductor connection member)
35: depression
36: high-frequency circuit
41: ground pad (ground conductor connection member)
42: signal line pad (signal line conductor connection member)
51: external connection ground conductor (ground conductor connection member)
52: external connection signal line conductor (signal line conductor connection member)
60: printed circuit board (second substrate)
61: ground pad (front layer ground conductor)
62: signal line pad (front layer signal line conductor)
72: signal line conductor
74: columnar signal line conductor
81: ground conductor
83: columnar ground conductor

The invention claimed is:
1. A surface mount high-frequency circuit comprising:
a first substrate in which a first ground conductor is formed on a first surface, and a signal line conductor of a high-frequency circuit, a second ground conductor, and the high-frequency circuit are formed on a second surface opposing the first surface;
an insulating layer which is deposited on a side of the second surface of the first substrate, and in which an interlayer connection ground conductor electrically connected to the second ground conductor and an interlayer connection signal line conductor electrically connected to the signal line conductor are formed inside;
a ground conductor connection member that is electrically connected to the interlayer connection ground conductor;
a signal line conductor connection member that is electrically connected to the interlayer connection signal line conductor; and
a second substrate in which a front layer ground conductor electrically connected to the ground conductor connection member and a front layer signal line conductor electrically connected to the signal line conductor connection member are formed on a front layer, wherein
a plurality of the ground conductor connection members are discretely disposed to surround the signal line conductor connection member, and
a plurality of the interlayer connection ground conductors are discretely disposed to surround the interlayer connection signal line conductor.
2. The surface mount high-frequency circuit according to claim 1, wherein the front layer ground conductor is disposed to surround the front layer signal line conductor.

3. The surface mount high-frequency circuit according to claim 1, wherein
a columnar ground conductor that electrically connects the first ground conductor and the second ground conductor to each other is formed inside the first substrate, and
the columnar ground conductor and the interlayer connection ground conductor, and the ground conductor connection member are disposed at different positions when viewed from the first surface of the first substrate in a normal direction.

4. The surface mount high-frequency circuit according to claim wherein
an arrangement of the interlayer connection ground conductors that are plurally discretely disposed is positioned on the inner side of an arrangement of the ground conductor connection members that are plurally discretely disposed.

5. The surface mount high-frequency circuit according to claim 1, wherein
an arrangement of the interlayer connection ground conductors that are plurally discretely disposed and an arrangement of the ground conductor connection members that are plurally discretely disposed are positioned on a same circulation.

6. The surface mount high-frequency circuit according to claim 1, wherein
an arrangement of the interlayer connection ground conductors that are plurally discretely disposed is positioned on the outer side of an arrangement of the ground conductor connection members that are plurally discretely disposed.

7. The surface mount high-frequency circuit according to claim 3, wherein
an internal ground group that includes the ground conductor connection member, the interlayer connection ground conductor, the second ground conductor, and the columnar ground conductor is further formed in an inner area surrounded by the ground conductor connection members and the interlayer connection ground conductors that are plurally discretely disposed.

8. The surface mount high-frequency circuit according to claim 7, wherein
inner signal line groups each of which includes the signal line conductor connection member and the interlayer connection signal line conductor are formed at at least two locations, and
the inner ground group reduces electromagnetic field coupling to occur between the adjacent inner signal line groups.

* * * * *